(12) United States Patent
Lee et al.

(10) Patent No.: US 9,647,030 B2
(45) Date of Patent: May 9, 2017

(54) HORIZONTAL MAGNETIC MEMORY DEVICE USING IN-PLANE CURRENT AND ELECTRIC FIELD

(71) Applicant: KOREA UNIVERSITY RESEARCH AND BUSINESS FOUNDATION, Seoul (KR)

(72) Inventors: Kyung-Jin Lee, Seoul (KR); Seo-Won Lee, Seoul (KR)

(73) Assignee: KOREA UNIVERSITY RESEARCH AND BUSINESS FOUNDATION, Seoul (KR)

(*) Notice: Subject to any disclaimer, the term of this patent is extended or adjusted under 35 U.S.C. 154(b) by 0 days.

(21) Appl. No.: 14/428,949

(22) PCT Filed: Apr. 22, 2013

(86) PCT No.: PCT/KR2013/003366
§ 371 (c)(1),
(2) Date: Mar. 17, 2015

(87) PCT Pub. No.: WO2014/046360
PCT Pub. Date: Mar. 27, 2014

(65) Prior Publication Data
US 2015/0214274 A1 Jul. 30, 2015

(30) Foreign Application Priority Data
Sep. 21, 2012 (KR) ........................ 10-2012-0105356

(51) Int. Cl.
*H01L 27/22* (2006.01)
*H01L 43/08* (2006.01)
(Continued)

(52) U.S. Cl.
CPC ............ *H01L 27/222* (2013.01); *H01L 43/02* (2013.01); *H01L 43/08* (2013.01); *H01L 43/10* (2013.01); *G11C 11/161* (2013.01)

(58) Field of Classification Search
None
See application file for complete search history.

(56) References Cited

U.S. PATENT DOCUMENTS 5,465,185 A * 11/1995 Heim et al. ............... 360/324.11
5,688,380 A * 11/1997 Koike et al. ............... 204/192.2
(Continued)

FOREIGN PATENT DOCUMENTS

JP         2003-017782         1/2003

*Primary Examiner* — Eva Y Montalvo
*Assistant Examiner* — Kevin Quinto
(74) *Attorney, Agent, or Firm* — Duane Morris LLP; J. Rodman Steele, Jr.; Gregory M. Lefkowitz (57) ABSTRACT

Provided is a magnetic memory device for applying an in-plane current to a conductive wire adjacent to a free magnetic layer having an in-plane magnetic anisotropy to induce a flux reversal of the free magnetic layer and simultaneously applying a voltage to each magnetic tunnel junction cell selectively to reverse magnetization of the free magnetic layer selectively at each specific voltage. The magnetic memory device may implement high density integration by reducing a volume since a spin-hall spin-torque causing a flux reversal is generated at an interface of the conductive wire and the free magnetic layer, ensure thermal stability by enhancing perpendicular magnetic anisotropy of the magnetic layer, and reduce a critical current density by increasing an amount of spin current. In addition, by increasing tunnel magnetic resistance with a thick insulating body, the magnetic memory device may increase a reading rate without badly affecting the critical current density.

10 Claims, 3 Drawing Sheets

(51) Int. Cl.
*H01L 43/02* (2006.01)
*H01L 43/10* (2006.01)
*G11C 11/16* (2006.01)

(56) References Cited

U.S. PATENT DOCUMENTS

| | | | |
|---|---|---|---|
| 6,473,328 B1* | 10/2002 | Mercaldi | 365/130 |
| 6,600,184 B1* | 7/2003 | Gill | 257/295 |
| 6,807,092 B1* | 10/2004 | Braun | 365/173 |
| 7,465,589 B2 | 12/2008 | Slaughter et al. | |
| 8,363,459 B2 | 1/2013 | Zhu et al. | |
| 8,416,620 B2 | 4/2013 | Zheng et al. | |
| 2002/0085411 A1* | 7/2002 | Freitag et al. | 365/158 |
| 2006/0087880 A1* | 4/2006 | Mancoff et al. | 365/158 |
| 2014/0169088 A1* | 6/2014 | Buhrman | G11C 11/18 365/158 |

\* cited by examiner

HORIZONTAL MAGNETIC MEMORY DEVICE USING IN-PLANE CURRENT AND ELECTRIC FIELD

CROSS-REFERENCE TO RELATED APPLICATIONS

This application is a §371 national stage entry of International Application No. PCT/KR20131003366, flied on Apr. 22, 2013, which claims priority to South Korean Patent Application No. 10-2012-0105356, filed on Sep. 21, 2012, the entire contents of which are incorporated herein by reference.

TECHNICAL FIELD

The following disclosure relates to a magnetic memory device using a magnetic tunnel junction, and more particularly, to a magnetic memory device for applying an in-plane current to a conductive wire adjacent to a free magnetic layer having a horizontal magnetic anisotropy to induce a flux reversal of the free magnetic layer and simultaneously applying a voltage to each magnetic tunnel junction cell selectively to reverse magnetization of the free magnetic layer selectively at each specific voltage.

BACKGROUND ART

A ferromagnetic body means a material which is spontaneously magnetized even though a strong magnetic field is not applied thereto from the outside. In a magnetic tunnel junction structure (including a first magnetic body, an insulating body and a second magnetic body) in which an insulating body is interposed between two ferromagnetic bodies, a tunnel magneto resistance effect in which an electric resistance varies depending on relative magnetization orientations of two magnetic layers occurs, since up-spin and down-spin electrons flow at different degrees at the magnetic tunnel junction structure while tunneling an insulating body. This tunnel magneto resistance has a greater value than a huge magnetic resistance generated at a spin valve structure (including a first magnetic body, a non-magnetic body and a second magnetic body) in which a non-magnetic body is interposed between two ferromagnetic bodies instead of the insulating body, and thus this is widely used as an essential technique of a magnetic memory device for sensors and information storage in order to rapidly read data recorded on a hard disk.

Due to the tunnel magneto resistance effect, relative magnetization orientations of two magnetic layers control a flow of current. Meanwhile, according the Newton's third law, namely the law of action and reaction, if the magnetization orientation may control a flow of current, it is also possible to control a magnetization orientation of the magnetic layer by applying a current by the reaction. If a current is applied to the magnetic tunnel junction structure in a perpendicular (thickness) orientation, the current spin-polarized by the first magnetic body (the fixed magnetic layer) transfers its spinning angular momentum while passing through the second magnetic body (the free magnetic layer). A torque felt by magnetization due to the transfer of spinning angular momentum is called a spin transfer torque, and it is possible to fabricate a device for reversing magnetization of the free magnetic layer or continuously rotating the free magnetic layer by using the spin transfer torque.

Figure 1:
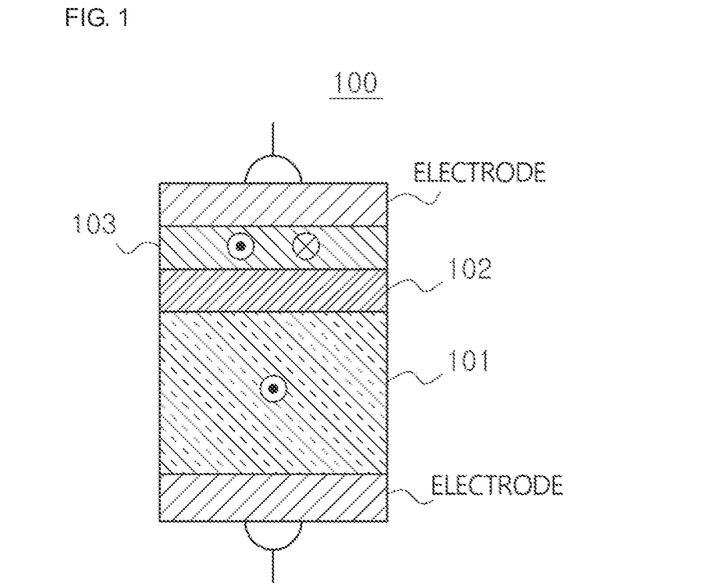
FIG. 1 is a cross-sectional view showing a configuration of an existing magnetic memory device using a spin transfer torque.

An existing magnetic memory device in which a magnetic tunnel junction structure composed of a magnetic body with in-plane magnetization is applied to a film surface basically has a structure as shown in FIG. 1, which has a structure including an electrode, a first magnetic body (a fixed magnetic layer) 101, an insulating body 102, a second magnetic body (a free magnetic layer) 103 whose magnetization orientation varies due to a current, and an electrode. A transistor is disposed at an upper or lower portion of the magnetic tunnel junction structure, and the transistor plays a role of selectively providing a current flowing in a direction perpendicular to the magnetic tunnel junction located at an upper or lower portion. In FIG. 1, a magnetization orientation of a magnetic body may be aligned as a direction penetrating into the ground or emitting from the ground. Here, the second magnetic body is connected to the electrode so that a flux reversal is induced by a current perpendicularly applied to the film surface. At this time, two electric signals with high and low resistances are implemented according to relative magnetization orientations of the fixed magnetic layer and the free magnetic layer, and a magnetic memory device may be applied to record the above data as "0" or "1".

If an external magnetic field is used instead of current in order to control magnetization of the free magnetic layer, a half-selected cell problem becomes serious as the device has a smaller size, and thus there is a limit in high density integration of the device. Meanwhile, if a spin transfer torque generated by applying a current is used to the device, flux reversal of the cell may be easily induced regardless of the size of the device. According to the physical instrument of the above spin transfer torque, the intensity of spin transfer torque generated at the free magnetic layer is determined by an amount of applied current density, and thus there exists a critical current density for flux reversal of the free magnetic layer. If both the fixed magnetic layer and the free magnetic layer are composed of material with an in-plane magnetic anisotropy, the critical current density $J_C$ may be expressed like Equation 1 below.

$$J_c = \alpha \frac{2e}{\hbar} \frac{M_S d}{\eta} \left( H_K + \frac{N_d M_S - H_{K\perp}}{2} \right) = \alpha \frac{2e}{\hbar} \frac{M_S d}{\eta} (H_{K,\mathit{eff}}) \quad \text{Equation 1}$$

In Equation 1, α represents a Gilbert damping constant, $\hbar$ (=1.05×10$^{-34}$ J·s) is obtained by dividing a Planck constant by 2π, e(=1.6×10$^{-19}$ C) represents an electron charge amount, η represents a spin polarization efficiency constant determined by the material and entire structure and having a value between 0 and 1, $M_S$ represents a saturation magnetization amount of a magnetic body, d represents a thickness of the free magnetic layer, $H_K$ represents an in-plane magnetic anisotropy magnetic field of the free magnetic layer, $N_d$ represents an effective demagnetizing field constant and has a value between 0 and 4π depending on the shape of the free magnetic layer when being described in a CGS unit, $H_{K\perp}$ represents a perpendicular magnetic anisotropy magnetic field of the free magnetic layer, and an in-plane effective anisotropic magnetic field $H_{K,\mathit{eff}}$ of the free magnetic layer is defined as $H_{K,\mathit{eff}}=(H_K+(N_d M_S-H_{K\perp})/2)$.

If the cell size is reduced to make a highly integrated memory device, a super-paramagnetic limit occurs in which a recorded magnetization orientation is arbitrarily changed due to thermal energy at normal temperature. This may result in undesired deletion of recorded magnetic data. The time t during which a magnetization orientation is averagely maintained against thermal energy may be expressed as Equation 2 below.

$$\tau = \tau_0 \exp\left(\frac{KV}{k_B T}\right) = \tau_0 \exp\left(\frac{H_K M_S V}{2 k_B T}\right)$$ Equation 2

In Equation 2, $T_0$ is a reciprocal of attempt frequency and has a value of about 1 ns, K represents an effective anisotropic energy density ($=H_K M_S/2$) of the free magnetic layer, V represents a volume of the device, $k_B$ represents a Boltzmann constant ($=1.381 \times 10^{-16}$ erg/K), and T represents a Kelvin temperature.

Here, $KV/k_B T$ is defined as thermal stability $\Delta$ of the magnetic memory device. For commercialization as a nonvolatile memory, a condition of $\Delta > 50$ should be satisfied in general cases. If the volume V of the free magnetic layer is reduced for high density integration of the device, K should be increased to satisfy the condition of $\Delta > 50$, and as a result it can be found that $J_c$ also increases. An amount of current provided from a device which applies a current to the magnetic tunnel junction is generally proportional to the size of a transistor connected each magnetic tunnel junction, and this means that the size of the transistor should be greater than a suitable level in order to apply a current density of $J_c$ or above. Therefore, a size of the transistor for applying a current of $J_c$ or above may be a limit in high density integration of the magnetic memory device.

In addition, in the basic structure, if the thickness of the insulating body increases while a current flows through the magnetic tunnel junction, the difference between up-spin and down-spin tunneling electrons becomes greater, and thus the tunnel magneto resistance increases. However, in this case, when the same voltage is applied, the amount of the tunneling current decreases, and thus it becomes very difficult to effectively apply a spin transfer torque for flux reversal to the free magnetic layer. In other words, if the thickness of the insulating body increases, the tunnel magneto resistance also increases which is an essential element in commercialization since a magnetization state may be rapidly read, but it is very difficult to implement a device which satisfies two factors simultaneously since the current density is reduced.

DISCLOSURE

Technical Problem

An embodiment of the present disclosure is directed to providing a magnetic memory device, which may induce a flux reversal of a free magnetic layer by means of a spin-hall spin-torque caused by an in-plane current flowing through a conductive wire adjacent to the free magnetic layer and selectively induce a flux reversal of each cell by using a voltage selectively applied to each magnetic tunnel junction cell, thereby implementing high density integration of the device as well as solving two problems of an existing magnetic tunnel junction structure in which a flux reversal of a free magnetic layer is induced by a spin transfer torque caused by a current flowing perpendicularly, namely (i) a problem in which for a high density design, a size of a magnetic tunnel junction and a size of a transistor connected thereto should be reduced simultaneously, but since an intensity of current perpendicularly provided to each magnetic tunnel junction is proportional to a size of a transistor connected to a lower or upper portion of each magnetic tunnel junction, the size of a transistor for applying a current of $J_c$ or above may be a limit in high density integration of the magnetic memory device, and (ii) a problem in that if the insulating body of the magnetic tunnel junction structure has a greater thickness, the tunnel magneto resistance increases which allows a magnetization state to be read more rapidly, but simultaneously the current density is reduced which makes it difficult to change the magnetization state.

Technical Solution

In one general aspect of the present disclosure, there is provided a magnetic memory device, which includes a plurality of magnetic memory cells, each including a fixed magnetic layer, an insulating layer and a free magnetic layer;

wherein the magnetic memory device comprises: a conductive wire provided adjacent to the free magnetic layer to apply an in-plane current to the magnetic memory cell; and an element configured to independently supplying a voltage to each of the magnetic memory cells, wherein the fixed magnetic layer is a film having a fixed magnetization orientation and made of material magnetized in a direction parallel to a film surface, wherein the free magnetic layer is a film having a variable magnetization orientation and made of material magnetized in a direction parallel to a film surface, and wherein a magnetization orientation of each magnetic memory cell is selectively varied according to the applied in-plane current and the voltage supplied to each of the magnetic memory cells.

According to an embodiment of the present disclosure, the fixed magnetic layer may be made of material selected from the group consisting of Fe, Co, Ni, B, Si, Zr and mixtures thereof.

According to an embodiment of the present disclosure, the fixed magnetic layer may have a diamagnetic body structure including a first magnetic layer, a non-magnetic layer and a second magnetic layer, the first magnetic layer and the second magnetic layer may be independently made of material selected from the group consisting of Fe, Co, Ni, B, Si, Zr and mixtures thereof, and the non-magnetic layer may be made of material selected from the group consisting of Ru, Cu and mixtures thereof.

According to an embodiment of the present disclosure, the fixed magnetic layer may have an exchange-biased diamagnetic body structure including an anti-ferromagnetic layer; a first magnetic layer; a non-magnetic layer; and a second magnetic layer, the anti-ferromagnetic layer may be made of material selected from the group consisting of Ir, Pt, Mn and mixtures thereof, the first magnetic layer and the second magnetic layer may be independently made of material selected from the group consisting of Fe, Co, Ni, B, Si, Zr and mixtures thereof, and the non-magnetic layer may be made of material selected from the group consisting of Ru, Cu and mixtures thereof.

According to an embodiment of the present disclosure, the free magnetic layer may be made of material selected from the group consisting of Fe, Co, Ni, B, Si, Zr and mixtures thereof.

According to an embodiment of the present disclosure, the insulating layer may be made of material selected from the group consisting of $AlO_x$, $MgO$, $TaO_x$, $ZrO_x$ and mixtures thereof.

According to an embodiment of the present disclosure, the conductive wire configured to applying the in-plane current may be made of material selected from the group consisting of Cu, Ta, Pt, W, Gd, Bi, Ir and mixtures thereof.

Advantageous Effects

The magnetic memory device according to the present disclosure uses a principle in which a flux reversal is induced to a free magnetic layer by a spin-hall spin-torque generated at the free magnetic layer when a current flows along a conductive wire adjacent to the free magnetic layer and a voltage applied to each magnetic memory cell, and the spin-hall spin-torque plays a role of inducing a flux reversal to the free magnetic layer. In addition, a voltage applied to a specific cell changes a magnetic anisotropy of a magnetic layer included in the cell so that a flux reversal may be selectively induced to the specific cell.

In a flux reversal by a spin-hall spin-torque, the critical current density is proportional to effective magnetic anisotropy and volume of the magnetic layer, similar to an existing configuration, but is also proportional to an amount of spin current with respect to the applied current generated by the spin-hall effect. Therefore, when reducing a volume of the device for high density integration of the device, magnetic anisotropy may be increased to ensure thermal stability, and an amount of generated spin current may be effectively increased to reduce a critical current density. In other words, the memory device of the present disclosure may ensure thermal stability and satisfy a critical current density simultaneously.

In addition, since a current for generating a spin-hall spin-torque to reverse magnetization does not flow perpendicularly through the device but flows into the plane of the conductive wire, an element such as a transistor for supplying the current may be disposed out of an arrangement composed of magnetic tunnel junction cells. By doing so, the size of the element for supplying a current may be relatively freely adjusted regardless of a size of the magnetic tunnel junction element, and a great current over a critical current density which allows a flux reversal by generating a spin-hall spin-torque may be easily applied.

Moreover, even though electrons transfer a spin-torque by tunneling an insulating body in a magnetic tunnel junction of an existing configuration, in the subject disclosure, the spin-hall spin-torque is generated at an interface of the free magnetic layer adjacent to the conductive wire, and thus a current does not need to flow through the insulating body in the magnetic tunnel junction by tunneling. Therefore, even though the thickness of the insulating body is increased to sufficiently raise tunnel magneto resistance, the critical current density may not be affected. In other words, the memory device of the present disclosure may enhance a reading rate of a magnetization state by raising tunnel magneto resistance regardless of the critical current density.

BEST MODE

Hereinafter, the present disclosure will be described in more detail with reference to accompanying drawings.

Figure 2:
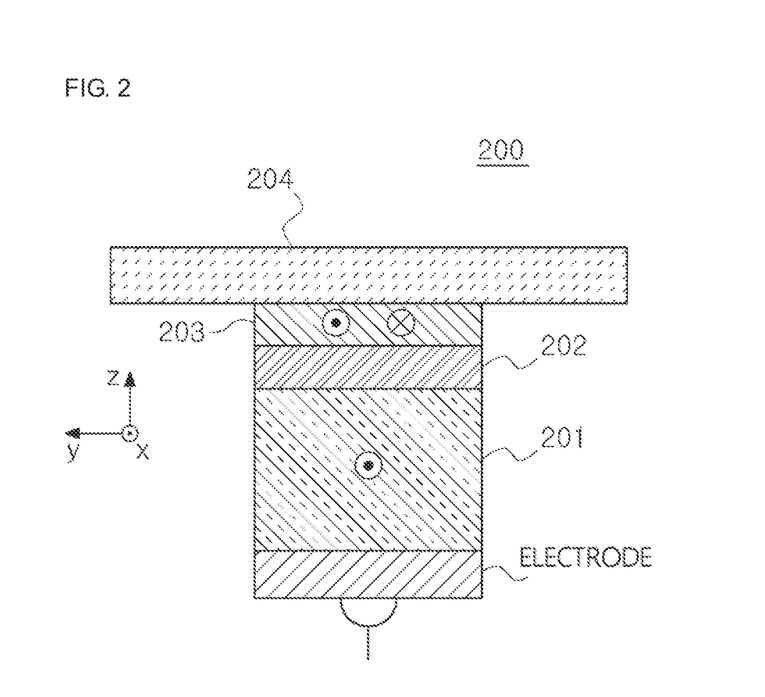
FIG. 2 is a cross-sectional view showing a configuration of a magnetic memory device according to an embodiment of the present disclosure.

As shown in FIG. 2, a magnetic memory device according to the present disclosure includes an electrode, a fixed magnetic layer 201, an insulating body 202, a free magnetic layer 203 and a conductive wire 204, and a current applied to induce a flux reversal to the free magnetic layer flows in an in-plane direction to the conductive wire 204.

Here, a magnetization orientation of the magnetic layer is aligned in an x or −x direction. Up-spin and down-spin electrons flowing in the conductive wire are biased into different directions due to spin-trajectory interaction, thereby causing a spin-hall effect, and thus spin currents are generated in all directions perpendicular to the current direction.

At this time, a spin current generated in each direction has a spin component biased perpendicular to the direction. Based on the coordinate system depicted in FIG. 2, if an in-plane current in the conductive wire 204 flows in any direction, among the generated spin current, a spin current flowing in a −z direction, namely a spin current incident to the free magnetic layer, has a x-directional or −x-directional spin component and flows to the free magnetic layer. Due to the spin current flowing as above, the magnetic body receives a spin-torque, and the received spin-torque is called a spin-hall spin-torque. The free magnetic body receiving the spin-hall spin-torque induces a flux reversal from a +x axis to a −x axis, or from a −x axis to a +x axis, depending on the direction of the applied current.

In addition, in the magnetic memory device according to the present disclosure, a voltage, namely an electric field, may be applied to a specific cell in order to induce a flux reversal selectively to a plurality of magnetic memory cells.

If a voltage, namely an electric field, is applied to the magnetic tunnel junction in a perpendicular direction, the perpendicular magnetic anisotropy energy density $K\perp$ of the magnetic layer varies. If a voltage is applied to the magnetic tunnel junction, an electric field is formed, and due to the formed electric field, a perpendicular magnetic anisotropy energy density of the magnetic body increases or decreases depending on the orientation of the electric field. For example, if the perpendicular magnetic anisotropy energy density increased when applying a voltage V is defined as $\Delta K\perp(V)$, an effective anisotropic magnetic field $H_{K,eff}$ of the free magnetic layer is replaced with $H_{K,eff}=(H_K+(N_dM_S-H_{K,\perp eff})/2)$. Here, $H_{K,\perp eff}=H_{K\perp}+\Delta H_{K\perp}$, and the perpendicular magnetic anisotropy magnetic field change $\Delta H_{K\perp}$ by $\Delta K\perp$ (V) is described as $\Delta H_{K\perp}=2K\perp(V)/M_S$. Therefore, it can be understood that when a voltage is applied, $H_{K,eff}$ decreases. Since $H_{K,eff}$ represents how strong the magnetization of the free magnetic layer is maintained in an easy magnetization axis, by applying a voltage to decrease $H_{K,eff}$, the magnetization of the free magnetic layer may be more easily reversed.

The principle of selectively inducing a flux reversal to each cell will be described with reference to FIG. 3. In FIG.

3, when a plurality of magnetic tunnel junction cells 301 are in contact with the conductive wire 204, if a current is applied through the conductive wire 204, the free magnetic layer of each cell may induce a flux reversal according to the above principle. The current flowing in the conductive wire 204 is provided from an element such as a transistor which is connected to an end of the conductive wire 204 to apply a current thereto. At this time, if the applied current has so great intensity to overcome effective magnetic anisotropy of the free magnetic layer, the free magnetic layers of all cells connected to the conductive wire will induce a flux reversal. However, if a voltage is independently applied only to a cell which is to be selected in a state where a current with an insufficient intensity is applied, effective magnetic anisotropy of the free magnetic layer included in the selected cell may decrease and thus only the cell may selectively induce a flux reversal. The voltage applied to each cell is provided from an element which is independently connected to each cell to apply a voltage thereto. The voltage applying element may be a transistor or a diode. At this time, a current is also applied to an unselected cell through the conductive wire 204, similar to the selected cell, but its intensity is not so great to overcome the magnetic anisotropy, and thus a flux reversal is not induced.

In the magnetic memory device of the present disclosure, a device size is reduced to implement high density integration and maintain thermal stability, and a reading rate of a memory is enhanced by increasing tunnel magneto resistance while lowering a critical current density.

In addition, the magnetic memory device of the present disclosure includes a flux reversal of the free magnetic layer by using a spin-hall spin-torque generated by a current flowing in a conductive wire adjacent to the free magnetic layer, and the critical current density for a flux reversal is independent from the thickness of the insulating body which determines thermal stability and tunnel magneto resistance. In addition, in order to select a cell, a voltage is applied to a selected cell to form a magnetic field, and the change of magnetic anisotropy caused therefrom is used.

The magnetic memory device according to the present disclosure includes a fixed magnetic layer 201, an insulating body 202, a free magnetic layer 203 and a conductive wire 204. The fixed magnetic layer is a film having a fixed magnetization orientation and made of material magnetized in a direction parallel to a film surface, and the free magnetic layer is a film having a variable magnetization orientation selected changed by a current applied through an adjacent conductive wire a selectively applied electric field and made of material magnetized in a direction parallel to a film surface.

When an in-plane current flows through a conductive wire adjacent to the free magnetic layer, a spin-hall spin-torque is generated at the free magnetic layer by the spin-hall effect, and the magnetization of the free magnetic layer is reversed. At this time, in order to selectively induce a flux reversal to a cell, a voltage is applied to a cell which is to be selected. The cell to which the voltage is applied forms an electric field due to the applied voltage, and thus an effective magnetic anisotropy of the magnetic layer varies. Therefore, a flux reversal may be induced only to a selected cell by applying a voltage thereto.

The current applied to the conductive wire is provided from an element such as a transistor which is connected to the conductive wire to apply a current, and the voltage applied to each cell is provided from an element which is connected to each cell to apply a voltage. The element for proving a current or a voltage may be a transistor or a diode.

In the magnetic memory device according to the present disclosure, a spin-hall spin-torque inducing a flux reversal is generated at an interface of the conductive wire 204 and the free magnetic layer 203, and thus it is possible to ensure thermal stability by enhancing magnetic anisotropy of the magnetic layer and decrease a critical current density by increasing an amount of a spin current while implementing high integration of the device by reducing a volume. In addition, by increasing tunnel magnetic resistance with a thick insulating body, the magnetic memory device according to the present disclosure may increase a reading rate of a memory without badly affecting the critical current density.

FIG. 2 is a cross-sectional view showing a configuration of a magnetic memory device using a spin-hall spin-torque and an electric field according to an embodiment of the present disclosure. The device according to the present disclosure basically includes an electrode, a fixed magnetic layer 201 with in-plane magnetization in a parallel direction, an insulating body 202, a free magnetic layer 203 with in-plane magnetic anisotropy, and a conductive wire 204, wherein a magnetization orientation of the free magnetic layer 203 selectively varies according to an in-plane current flowing in the conductive wire as well as an electric field.

If a voltage is applied to a cell to be selected in order to selectively induce a flux reversal to a plurality of magnetic tunnel junction cells, magnetic anisotropy of the free magnetic layer of the cell varies. In this state, if a suitable in-plane current is applied through the conductive wire 204, the free magnetic layer receives a spin-hall spin-torque and induces a flux reversal.

Figure 3:
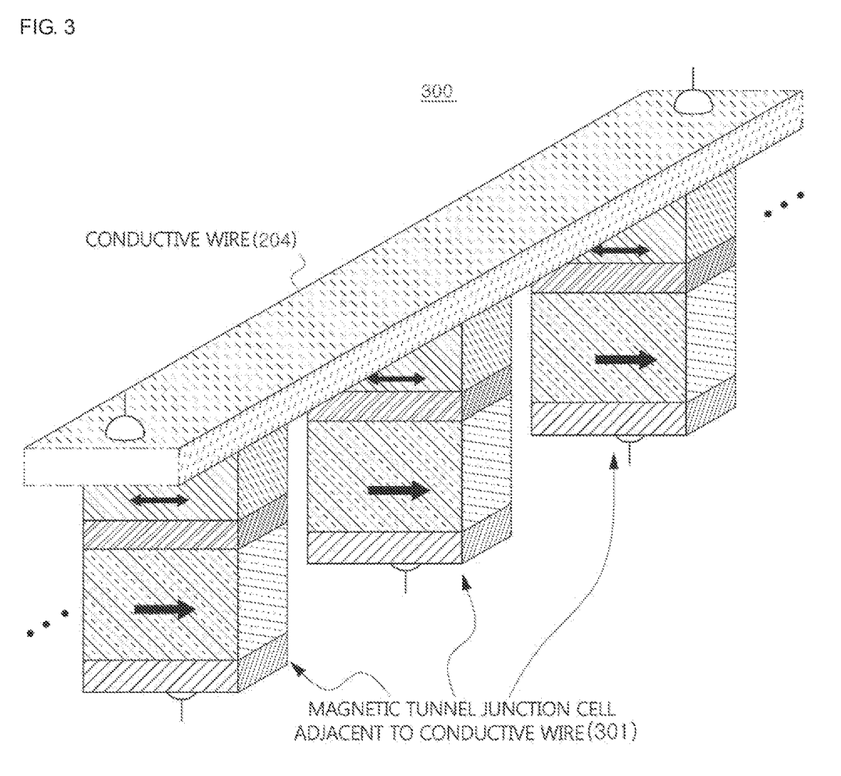
FIG. 3 is a cross-sectional view showing a configuration of a magnetic memory device according to an embodiment of the present disclosure, in which a plurality of magnetic tunnel junction structures capable of selectively inducing a flux reversal by using a spin-hall spin-torque and an electric field are joined to a conductive wire.

FIG. 3 is a cross-sectional view showing a configuration of a magnetic memory device according to an embodiment of the present disclosure in which a plurality of magnetic tunnel junction structures 301 capable of selectively inducing a flux reversal by a spin-hall spin-torque and an electric field are joined to the conductive wire 204. By means of an element connected to the conductive wire 204 to apply a current thereto, a current flows into the plane of the conductive wire to cause a spin-hall spin-torque to all cells joined to the conductive wire 204, and by means of an element connected to each cell to apply a voltage thereto, a voltage is applied only to a specific cell to form an electric field and allows the specific cell to selectively induce a flux reversal.

As described above, there is a difference in effective magnetic anisotropy between a cell selected by applying a voltage and a cell unselected. If the effective magnetic anisotropy of a cell to which a voltage is applied to form an electric field decreases in comparison to a cell where an electric field is not formed, a flux reversal may be induced just with a smaller spin-hall spin-torque and magnetic field. In other words, if a voltage is applied only to a cell to be selected in a state where a suitable current is applied to the conductive wire 204, a flux reversal may be induced only to the selected cell. In this case, since a current which generates a spin-hall spin-torque flows in the horizontal direction only at the conductive wire 204, this may be independent from thermal stability and tunnel magnetic resistance of the device, and thus it is possible to implement a magnetic memory device which simultaneously ensure thermal stability and increase tunnel magnetic resistance.

The magnetic memory device according to the present disclosure may be implemented as small as possible by using a patterning technique in order to obtain a high current density.

[Mode For Invention]

Hereinafter, the present disclosure will be described in more detail based on examples. However, these examples are just for better understanding of the present disclosure, and it is obvious to those skilled in the art that the present disclosure is not limited or restricted by experiment conditions, materials or the like of the examples.

EXAMPLE

Effects of the magnetic memory device according to the present disclosure have been checked by means of micromagnetic modeling using a motion equation of magnetization.

The motion equation of magnetization may be expressed like Equation 3 below.

$$\frac{\partial m}{\partial i} = -\gamma m \times H_{eff} + \alpha m \times \frac{\partial m}{\partial t} - \frac{\theta_{SH} \gamma \hbar l}{2eM_S V} m \times (m \times \hat{x}) \quad \text{Equation 3}$$

In Equation 3, m represents a unit magnetization vector of the free magnetic layer 203, γ represents a magnetic rotation constant, $H_{eff}$ represents all effective magnetic field vectors of the free magnetic layer 203, α represents a Gilbert damping constant, $\theta_{SH}$, represents a ratio of a spin current with respect to the applied current formed by the spin-hall effect, ℏ (=1.05×10$^{-34}$ J·s) represents a value obtained by dividing a Planck constant by 2π, l represents an applied current, e(=1.6×10$^{-19}$ C) represents an electron charge amount, $M_S$ represents a saturation magnetization amount of the free magnetic layer, and d represents a thickness of the free magnetic layer 205. Coordinate directions (x, y, z) of Equation 3 are depicted in FIG. 2.

EXPERIMENTAL EXAMPLE 1

Figure 4:
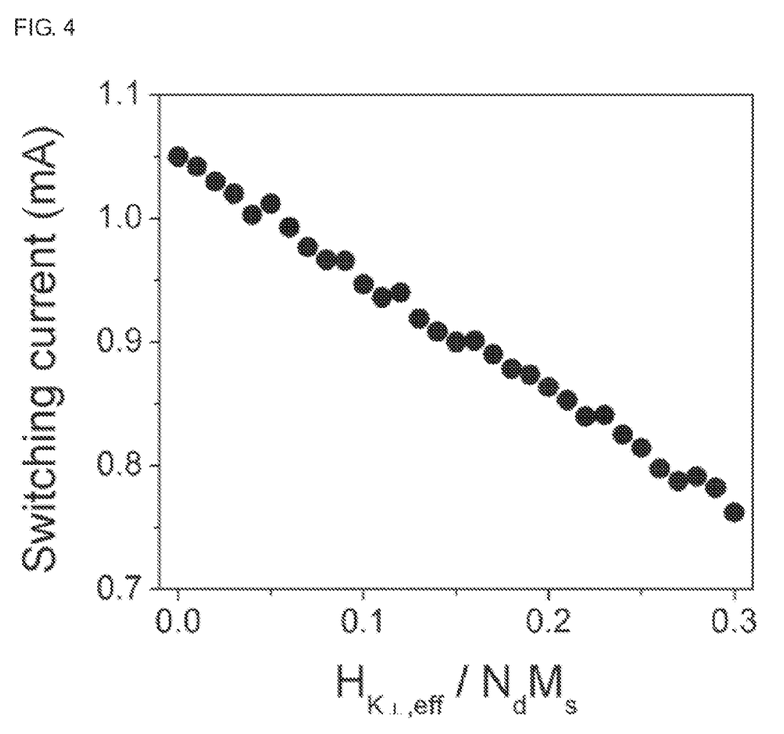
FIG. 4 is a graph showing a flux reversal current when an effective perpendicular magnetic anisotropy magnetic field $H_{K,\perp eff}$ varies with respect to $N_dM_S$ with the same ratio as a horizontal axis by a voltage (electric field) applied to each magnetic tunnel junction according to an embodiment of the present disclosure.

Change of a flux reversal current (switching current) when an effective perpendicular magnetic anisotropy magnetic field $H_{K,\perp eff}$ varies by a magnetic field applied to the device of the present disclosure (1) As shown in FIG. 4, if an effective perpendicular magnetic anisotropy magnetic field $H_{K,\perp eff}$ of the free magnetic layer has the same ratio as a horizontal axis with respect to $N_dM_S$ according to a voltage applied to the magnetic memory device according to an embodiment of the present disclosure, the switching current varies.

(2) Structure and properties of the device are as follows.
Cross-sectional area of the entire structure=130×60 nm$^2$
Free magnetic layer 203: "thickness (t)=2 nm, saturation magnetization ($M_S$)=1000 emu/cm$^3$, Gilbert damping constant (α)=0.01, spin-hall angle ($\theta_{SH}$)=0.3"

(3) Referring to FIG. 4, it can be understood that the switching current decreases when the effective perpendicular magnetic anisotropy magnetic field $H_{K,\perp eff}$ of the free magnetic layer varies while increasing with the same ratio as a horizontal axis with respect to $N_dM_S$. This is because $H_{K,eff}$ proportional to the switching current has a relation with $H_{K,\perp eff}$ as follows: $H_{K,eff}=(H_K+(N_dM_S-H_{K\perp})/2)$. In other words, a switching current of a cell selected by applying a magnetic field is smaller than a switching current of an unselected cell. Therefore, it is possible to induce a flux reversal only to a selected cell by applying an appropriate current.

Hereinafter, reference symbols used in the accompanying drawings will be explained briefly.

100: configuration of an existing magnetic memory device
101: fixed magnetic layer   102: insulating body
103: free magnetic layer
200: configuration of a magnetic memory device according to the present disclosure
201: fixed magnetic layer   202: insulating body
203: free magnetic layer   204: conductive wire
300: configuration of a magnetic memory device according to the present disclosure in which a plurality of magnetic memory cells with a magnetic tunnel junction structure are joined to a conductive wire
301: a plurality of magnetic memory cells with a magnetic tunnel junction structure adjacent to the conductive wire

INDUSTRIAL APPLICABILITY

The magnetic memory device according to the present disclosure may implement high density integration by reducing a volume since a spin-hall spin-torque causing a flux reversal is generated at an interface of the conductive wire and the free magnetic layer, ensure thermal stability by enhancing magnetic anisotropy of the magnetic layer, and reduce a critical current density by increasing an amount of spin current. In addition, by increasing tunnel magnetic resistance with a thick insulating body, the magnetic memory device according to the present disclosure may increase a reading rate without badly affecting the critical current density.

The invention claimed is:

1. A magnetic memory device, comprising:
a plurality of magnetic memory cells, each including a fixed magnetic layer, an insulating layer and a free magnetic layer;
wherein the magnetic memory device comprises a conductive wire provided adjacent to the free magnetic layer to apply an in-plane current to the magnetic memory cell; and an element configured to independently supply a voltage to each of the magnetic memory cells,
wherein the fixed magnetic layer is a film having a fixed magnetization orientation and made of material magnetized in a direction parallel to a film surface,
wherein the free magnetic layer is a film having a variable magnetization orientation and made of material magnetized in a direction parallel to a film surface, and
wherein a magnetization orientation of a selected magnetic memory cell is selectively varied by decreasing an effective magnetic anisotropy of the free magnetic layer, and this is accomplished by the voltage that is selectively applied to a free magnetic layer when a spin Hall spin transfer torque is produced on an interface between the conductive wire and the free magnetic layer by an applied spin current, which is supplied by the in-plane current flowing in the conductive wire.

2. The magnetic memory device according to claim 1, wherein the fixed magnetic layer is made of material selected from the group consisting of Fe, Co, Ni, B, Si, Zr and mixtures thereof.

3. The magnetic memory device according to claim 1, wherein the fixed magnetic layer has a diamagnetic body structure including a first magnetic layer, a non-magnetic layer and a second magnetic layer,
wherein the first magnetic layer and the second magnetic layer are independently made of material selected from the group consisting of Fe, Co, Ni, B, Si, Zr and mixtures thereof, and wherein the non-magnetic layer is made of material selected from the group consisting of Ru, Cu and mixtures thereof.

4. The magnetic memory device according to claim 1, wherein the fixed magnetic layer has an exchange-biased diamagnetic body structure including an anti-ferromagnetic layer; a first magnetic layer; a non-magnetic layer; and a second magnetic layer,
wherein the anti-ferromagnetic layer is made of material selected from the group consisting of Ir, Pt, Mn and mixtures thereof,
wherein the first magnetic layer and the second magnetic layer are independently made of material selected from the group consisting of Fe, Co, Ni, B, Si, Zr and mixtures thereof, and
wherein the non-magnetic layer is made of material selected from the group consisting of Ru, Cu and mixtures thereof.

5. The magnetic memory device according to claim 1, wherein the free magnetic layer is made of material selected from the group consisting of Fe, Co, Ni, B, Si, Zr and mixtures thereof.

6. The magnetic memory device according to claim 1, wherein the insulating layer is made of material selected from the group consisting of $AlO_x$, $MgO$, $TaO_x$, $ZrO_x$, and mixtures thereof.

7. The magnetic memory device according to claim 1, wherein the conductive wire configured to applying the in-plane current is made of material selected from the group consisting of Cu, Ta, Pt, W, Gd, Bi, Ir and mixtures thereof.

8. The magnetic memory device according to claim 1, wherein each element configured to independently supply the in-plane current to each of the magnetic memory cells is selected from a transistor and a diode.

9. The magnetic memory device according to claim 1, wherein each element configured to independently supply the in-plane current to each of the magnetic memory cells is a transistor.

10. The magnetic memory device according to claim 1, wherein each element configured to independently supply the in-plane current to each of the magnetic memory cells is a diode.

* * * * *